United States Patent

Cucinotta

[11] Patent Number: 6,020,049
[45] Date of Patent: Feb. 1, 2000

[54] PRODUCT FOR PRODUCING VIAHOLES IN REINFORCED LAMINATES AND THE RELATED METHOD FOR MANUFACTURING VIAHOLES

[76] Inventor: Anthony J Cucinotta, 38 Sweetser St, Wakefield, Mass. 01880

[21] Appl. No.: 08/982,714

[22] Filed: Dec. 2, 1997

[51] Int. Cl.[7] ............................. B32B 3/00; G03C 3/00; H01R 9/09
[52] U.S. Cl. .................. 428/209; 174/262; 174/266; 430/16; 442/19; 442/23; 442/31; 428/901
[58] Field of Search ..................... 428/209, 901; 174/250, 261, 262, 266; 430/280.1, 16; 442/6, 19, 23, 31

[56] References Cited

U.S. PATENT DOCUMENTS

| | | | |
|---|---|---|---|
| 4,403,653 | 9/1983 | Davidson | 428/379 |
| 5,022,956 | 6/1991 | Cziep et al. | 156/643 |
| 5,283,107 | 2/1994 | Bayer et al. | 428/209 |
| 5,421,083 | 6/1995 | Suppelsa et al. | 174/250 |
| 5,700,607 | 12/1997 | Rath et al. | 430/280.1 |
| 5,858,615 | 1/1999 | Hawkins | 430/280.1 |

*Primary Examiner*—Deborah Jones
*Assistant Examiner*—Cathy F. Lam

[57] ABSTRACT

A reinforced laminate that is consists of conventional glass mesh, TEFLON mesh, etc. with copper clad to one or both sides and a positive or negative acting photoimageable dielectric material impregnated in the mesh. This photoimageable dielectric material is a substitute for conventional dielectrics like epoxy, polyimides, etc. This laminate construction will allow for via formation using established manufacturing methods for producing vias in printed circuits with minor process variations. This product will eliminate major process steps such as mechanical drilling, laser drilling and plasma etching. It will allow most printed circuit producers the capability of producing complex multilayer circuits that currently produced by relatively few circuit manufacturers. It eliminates processes such as plasma etching and laser processing and other capital-intensive methods that are currently in development or use. A further development as a result of this product allows for producing vias of any shape e.g. square holes, elliptical holes, slots, etc. It also results in certain designs for producing solid metal vias e.g. copper posts, which have higher conductivity and superior mechanical properties.

2 Claims, 2 Drawing Sheets

PRODUCT FOR PRODUCING VIAHOLES IN REINFORCED LAMINATES AND THE RELATED METHOD FOR MANUFACTURING VIAHOLES

BACKGROUND OF THE INVENTION

1. Field of Invention

This invention concerns a product (a laminate) and manufacturing method for producing multishaped viaholes for making printed circuits that allow for conduction from conductor patterns that are applied to 1 or more layers of substrate. It also allows for producing solid post connections in certain design applications. The laminate can consist of metal clad reinforced meshes and such meshes are impregnated with a photoimageable dielectric insulating material.

2. Description of Related Art

This product and method can be used to produce single or doubled side circuits as well as multilayer circuit boards. Most manufacturers using widely applied common methods manufacture these circuit boards. These methods involve procuring a laminate such as 1 oz. copper clad epoxy reinforced laminate from a laminate producer. The laminate is mechanically drilled, vias are metal electrolessly plated or made conductive for example by graphite coating, photoimaged, electroplated, removal of the photo image and etched. More advanced product with tight tolerances e.g. 0.005" vias require variations on the above described process that are highly capital intensive and reduce the processing windows so that the capability of the vast majority of manufacturers cannot enter this market. An example of this limitation is the expense and limiting factor for drilling small holes. Mechanical drilling of holes less than 0.014" holes requires expensive drill bits and low levels of productivity. The alternative is laser drilling which is capital equipment intensive and beyond the means of a majority of manufacturers. In other cases expensive plasma equipment is needed to produce these tight tolerance designs.

An example of this is described in U.S. Pat. No. 5,022,956, Cziep et al. In this patent the process uses conventional laminate construction e.g. copper clad epoxy coated glass weave. It employs plasma to remove the dielectric. This following described embodiment does not require plasma and uses a photoimageable dielectric that does not require plasma or other expensive techniques to remove the dielectric. It further differs form Cziep et al in that the via can be positioned within the described etched metal opening to form any shape via desired. This allows for any size metal opening and subsequently a photoimaged via opening within the original metal opening. Cziep's vias are limited to size and shape of the metal opening. That is, Cziep's vias cannot be further defined and positioned as the current embodiment puts forth.

SUMMARY OF THE INVENTION

In order to increase the capability of all manufacturers a new product and method has been developed to manufacture printed circuits with very tight tolerances utilizing existing equipment and processes that are currently in use by most producers of circuit boards and laminate materials.

These and other objects of the invention—product and method—are accomplished by means as follows.

The product, a laminate consisting of metal cladding, e.g. 1 oz. copper, bonded to a reinforced mesh-like material such as glass or TEFLON that has been impregnated with a photoimageable dielectric material. This laminate can be produced by well-established processes currently in use by many laminate producers such as IBM, General Electric, Polyclad etc. The basic change in the manufacturing would be a substitution of the impregnating resins such as epoxy with a photoimageable dielectric, which is available from several producers such as Taiyo, Shipley, Enthone, etc. There would be process alterations such cure times, coating in protective light, storage and transportation. Material cost will be higher but should be offset in elimination of processes by the user. The methods for utilizing this product are currently in use by virtually all manufacturers of printed circuit boards. The most significant advantages are in the elimination of cost intensive operation such as mechanical drilling and associated processes such as deburring and plasma etching. The added advantage of not investing in expensive capital equipment such as lasers and tighter processing controls.

The operations that would be necessary to process the above mentioned product are as follows: formation of the vias is done with photoimaging, etching and conventional via processing. A typical process sequence is precleaning for photoimaging, photoresist application, exposure of pattern for vias through a suitable mask, developing of photoresist, etching of vias in metal cladding leaving the photoimageable dielectric exposed. The photoimageable dielectric can now be masked with a phototool, exposed and washed out (developed) from the reinforced mesh leaving openings in that mesh for conventional electroless deposition processing to make the holes conductive for further electroplating and final curing of the dielectric.

Another sequence would be as described above but instead of just developing or removing the photoimageable dielectric it would be further photoimaged to define a via within the geometry of the etched metal via pattern. The advantage to this process would be a broader process window in which to define the via pattern. That is, it would allow tighter tolerance and placement of vias that would allow for design flexibility.

This product and methods make possible designs that are not achievable with conventional or advanced process methods or equipment. This product and methods allow the designer and manufacturer new concepts such as "square vias" or any shape via that a circuit designer can foresee. Mechanical or laser drilling produces round holes for all practical purposes. A photoimageable dielectric product and method eliminates this restriction. Not only does it allow for unique via geometries, it produces vias that have more materials in the connection or plated-thru-hole that result in a more mechanically sound structure e.g. solid posts and a higher conductive ability. A square hole has more volume, about 33%, than a round hole of a diameter that is equivalent to the length of a side of the square. Furthermore whereas a hole or via opening of 0.001" or less is possible using conventional processing with this invention, a conventional drilled hole of 0.001" is not viable because drill bits do not exist at this size. One would need a laser and/or a plasma unit, which is beyond most manufacturers means.

Therefore, the product and method are suitable for manufacturing of circuit boards using existing processes and equipment available to the vast majority of manufacturers rather than a select few. And a further advantage is that the product does not remove the reinforcing material e.g. glass mesh thereby lending further mechanical strength as well as improving aforementioned conductivity.

BRIEF DESCRIPTION OF THE DRAWING

The advantages of this product and accompanying methods may be seen from the following detailed description in conjunction with the figures, in which.

DESCRIPTION OF THE PREFERRED EMBODIMENT

Figure 1:
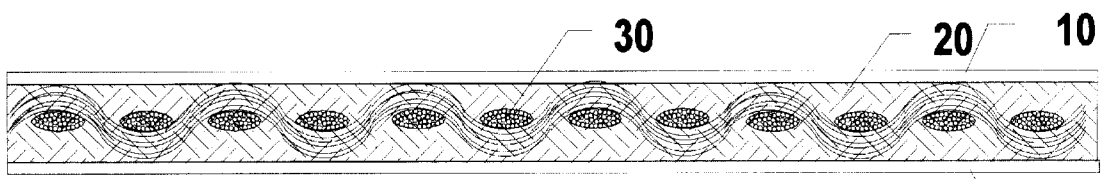
FIG. 1 is a schematic cross-sectional view of a structure showing a laminate structure that is representative of the invention e.g. the product.

The product as shown in FIG. 1 is representative of a laminate structure that is used to generate conductor patterns and vias that are suitable for producing a conducting substrate e.g. a printed circuit board. FIG. 1 shows a metal coating or sheet 10 which for these descriptions will be copper. Other base metals, metal oxides or alloys are also suitable but copper is mostly widely used. Glass weave meshing 30 is representative of a typical supporting substrate material but there are others such as Teflon, polyimides, non-wovens, prepunched solid substrates, etc. Again glass weave is the most common. This glass weave is commonly encapsulated or impregnated with many different resins and epoxy is usually the impregnating material of choice. The choice of impregnating material for this invention is a photoimageable dielectric material 20 which allows for a product and methods of processing that heretofore did not exist.

This product can be made by a variety of manufacturers of copper clad laminates using well-established manufacturing methods. The substitution of the normally used resins (e.g. epoxies) with a positive or negative acting photoimageable dielectric would be the major material substitution. The process variables that would be most affected would be curing times, coating speeds and material handling. Since the resin is now photosensitive protective means would have to be incorporated so to maintain the original photosensitive properties of the dielectric. This can be accomplished by light shielding, special wavelength lights or complete enclosure of that portion of the process. Curing cycles would be comparable to bringing the resin to a tack dry state which is similar in context to what is now referred a "B-stage" levels for normal resins. Material handling and storage would be similar to "B-stage" material.

Figure 2:
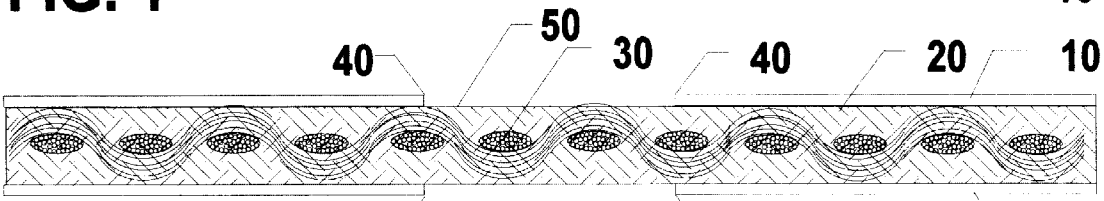
FIG. 2 is a schematic cross-sectional view obtained by the methods according to this invention.

FIG. 2 demonstrates how the laminate and hole pattern appears after conventional imaging methods. A most common method is by application of a suitable photoresist to the copper layer on one or both sides of the laminate FIG. 1. The photoresist can be either liquid or a dry film that are positive or negative reactive. After application of the photoresist a suitable mask is used to isolate the areas that require further processing. After exposing the photoresist the areas that are to be processed (the vias) are then cleared of unwanted photoresist by suitable developing means. In the case of a dry film the most common method is to process it through a developing solution that contains a 1% solution of sodium carbonate or potassium carbonate. After the unwanted photoresist is removed the remaining photoresist protects the laminate for further processing. FIG. 2 shows the formation of a pattern or a hole in the copper 10 for subsequently producing a via opening 40. This pattern was produced by an etch process that removes the unwanted copper.

Figure 3:
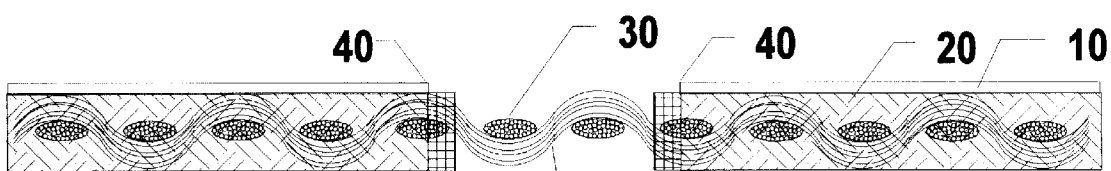
FIG. 3 and 4 demonstrates further processing of the product showing the details of how a via hole is produced.
Figure 4:
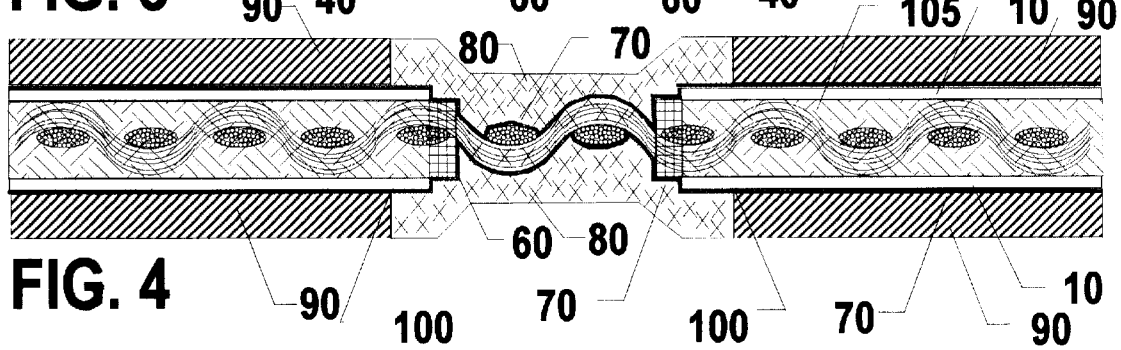

This exposes the photoimageable dielectric surfaces 50 for further processing. A phototool is used to define the desired pattern for the via. FIG. 3 demonstrates what the laminate appears like after exposure and developing out the unwanted photoimageable dielectric, the exposed photoimageable dielectric 60 is remaining and defines the via opening or hole. The exposing and developing processes are the same as processing normal negative or positive photoresists. The variables could be in light energy, exposure time, etc. in the exposing process. In developing the variables could be solution strength, temperature, dwell time, etc. The via shape can be of any desired pattern square, round, slot, etc. Again this is not viable with existing means such as mechanical drilling, laser drilling, punching etc. This process also bares the weave 30 and weave openings 35. The laminate is now prepared for further processing as shown in FIG. 4.

Figure 5:
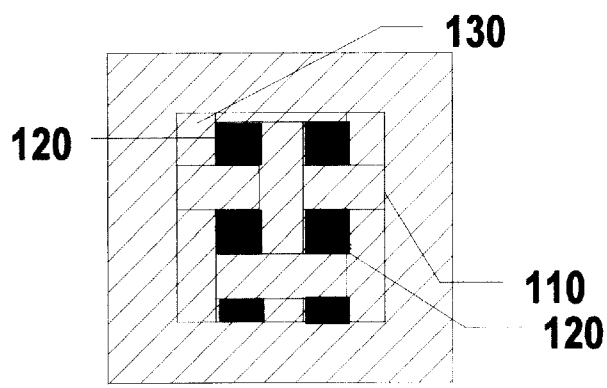
FIG. 5 shows a cross-sectional top view on how a via hole looks after processing.
Figure 6:
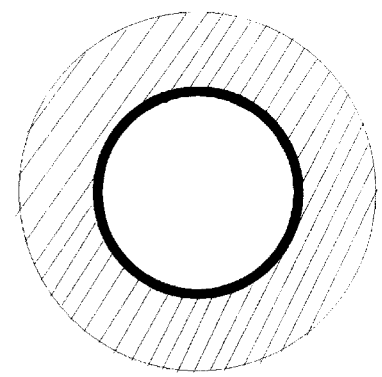
FIG. 6 is a top view of a conventional via

The first step would be to apply an electroless metal conductive coating or other conductive coating such as graphite to the entire substrate FIG. 3. FIG. 4 shows this coating 70 (thick black line) encasing the glass weave, photoimageable dielectric 60 and the rest of the laminate. At this stage the laminate is ready for further processing with conventional methods that is, photoimaging to define the conductors that are to be electroplated with coatings 80 like copper, tin, gold, solder etc. After electroplating, the exposed photoresist is removed; the laminate is etched to remove unwanted areas and finally soldermasked 90. The final step would be to postcure the photoimageable dielectric 105 throughout the entire laminate structure. This could occur during final cure of the soldermask depending on the type and cure parameters of the soldermask. FIG. 5 is a cross-section top view at points 100 in FIG. 4. It demonstrates the capability of this inventions abilities to define any shape via (square in this case) 110 and positioning of that via within the etched opening (square as shown but could be any shape). The solid areas 120 show solid plated through openings that are post like and have a higher conductivity than a normal round via FIG. 6. 130 shows the weave or mesh that makes this possible. If this weave was removed as it normally is with mechanical drilling the via would be round FIG. 6 and have less electroplated metal 140 therefore less conductivity. And because of the solid structure of a photoimageable dielectric formed via it has superior mechanical abilities.

Figure 7:
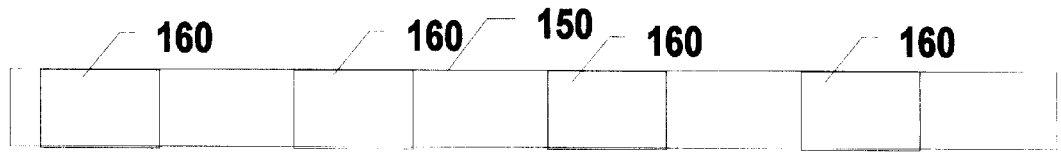
FIGS. 7 thru 11 illustrate one alternative and process with a non-mesh substrate
Figure 8:
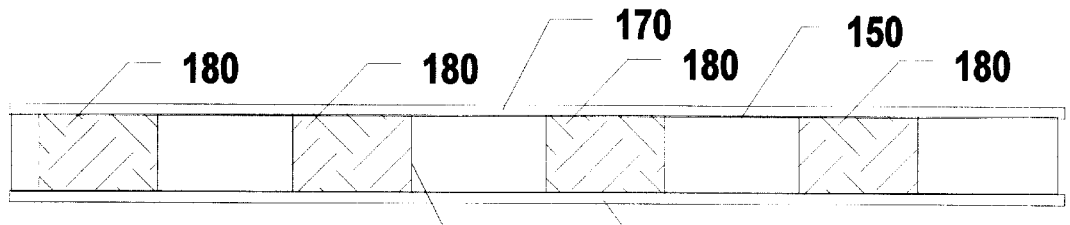

Another example possible with this technology is illustrated with FIGS. 7 thru 11. FIG. 7 is a substrate 150 that can be made of a variety of materials including non-wovens, Teflon, polyimide or any suitable insulating sheet material. Holes 160 can be made by any suitable means including casting, punching, drilling, etc. FIG. 8 shows a copper sheet 170 or other suitable conductor laminated to substrate 150 and holes 160 filled with the photoimageable dielectric 180.

Figure 9:
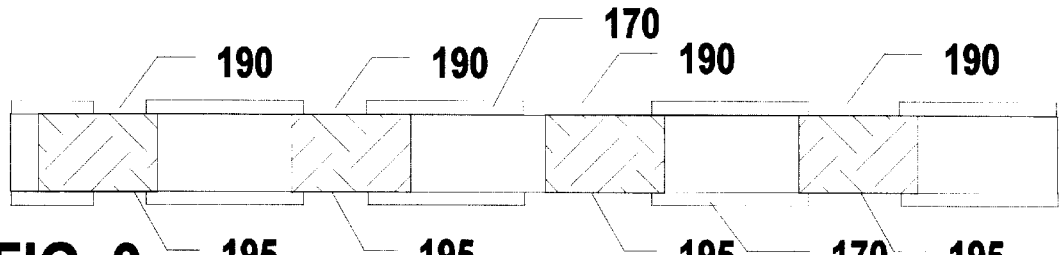

FIG. 9 illustrates the etching of holes 190 in the copper conductor 170 exposing the surface of the photoimageable dielectric 195.

Figure 10:
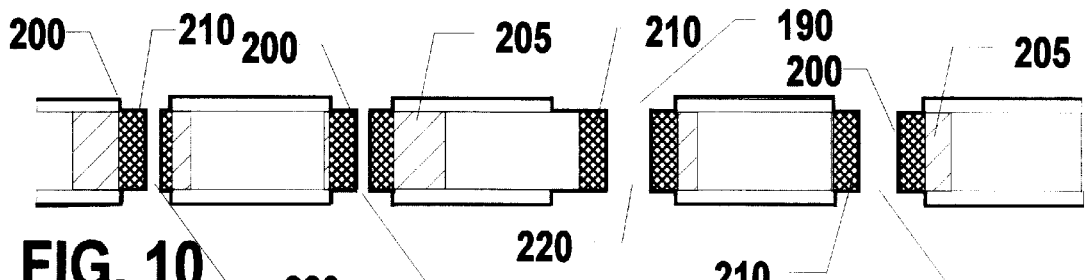

FIG. 10 shows the formation of the holes 220 in the dielectric. As explained previously this involves using a suitable phototool to expose the appropriate pattern on the photoimageable dielectric 210 and subsequently developing out the unexposed photoimageable dielectric creating vias 220. Note the flexibility in placing and sizing the vias within the etched copper image 190. 200 is the electroless conductive coating that has been applied to allow for subsequent electroplating processes. 205 is the remaining photoimageable dielectric.

Figure 11:
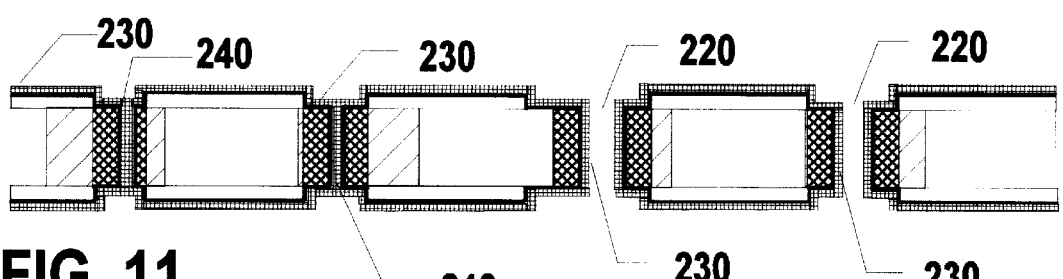

FIG. 11 shows the electroplating 230 that results in either filled vias 240 or open vias 220 if the designer so chooses.

The completed substrate FIG. 11 is now ready for further processing and final curing.

Of course, the foregoing description is directed to the above explanation for the present invention and modifications and other embodiments will be readily apparent to others skilled in this technology. Therefore it is understood that other embodiments of the present invention may be made without departing from the scope of the present invention as described herein and as claimed in the appended claims.

I claim:

1. A reinforced laminate consisting of a mesh material, a positive or negative photoimageable dielectric material impregnated therein, and a copper foil clad to one or both surfaces of said impregnated mesh material.

2. A reinforced laminate according to claim 1, wherein said mesh material is an insulating weave or a sheet material having via holes, thus allowing an electrical conductive coating to be electrolessly deposited over said mesh material and said via holes.

* * * * *